United States Patent [19]

Benn, Sr. et al.

[11] Patent Number: 4,968,854
[45] Date of Patent: Nov. 6, 1990

[54] DUAL ELASTOMER GASKET SHIELD FOR ELECTRONIC EQUIPMENT

[75] Inventors: Robert C. Benn, Sr.; Robert C. Benn, Jr., both of Danbury, Conn.

[73] Assignee: Vanguard Products Corporation, Danbury, Conn.

[21] Appl. No.: 269,350

[22] Filed: Nov. 10, 1988

[51] Int. Cl.$^5$ .............................................. H05K 9/00
[52] U.S. Cl. ........................... 174/35 GC; 219/10.55 D
[58] Field of Search ...................... 174/35 GC, 35 R; 219/10.55 D

[56] References Cited

U.S. PATENT DOCUMENTS

| | | | |
|---|---|---|---|
| 3,140,342 | 7/1964 | Ehrreich et al. | 174/35 GC |
| 3,230,294 | 1/1966 | McAdams | 174/35 GC |
| 3,260,788 | 7/1966 | Stetson | 174/35 GC |
| 3,371,147 | 2/1968 | Daubenberger et al. | 174/35 GC |
| 3,446,906 | 5/1969 | Zulauf | 174/35 GC |
| 3,502,784 | 3/1970 | Kunkel | 174/35 GC |
| 3,505,463 | 4/1970 | McAdams | 174/35 GC |
| 3,752,899 | 8/1973 | Bakker | 174/35 GC |
| 3,783,173 | 1/1974 | Twomey | 174/35 GC |
| 4,011,360 | 3/1977 | Walsh | 174/35 GC |
| 4,037,009 | 7/1977 | Severinsen | 174/35 GC X |
| 4,098,633 | 7/1978 | Kersten | 174/35 GC X |
| 4,218,507 | 8/1980 | Deffeyes et al. | 428/328 |
| 4,434,541 | 3/1984 | Powers, Jr. | 174/35 GC X |
| 4,575,578 | 3/1986 | Bogan et al. | 174/35 GC |
| 4,584,429 | 4/1986 | Raketti et al. | 174/35 GC X |
| 4,642,416 | 2/1987 | Rogner | 174/35 R |
| 4,652,695 | 3/1987 | Busby | 174/35 GC |
| 4,659,869 | 4/1987 | Busby | 174/35 GC |
| 4,662,967 | 5/1987 | Bogan et al. | 174/35 GC X |
| 4,670,347 | 6/1987 | Lasik et al. | 174/35 R X |
| 4,678,699 | 7/1987 | Kritchevsky et al. | 174/35 GC X |
| 4,720,606 | 1/1988 | Senn | 174/35 GC |

FOREIGN PATENT DOCUMENTS

| | | |
|---|---|---|
| 718161 | 11/1954 | United Kingdom . |
| 974919 | 11/1964 | United Kingdom . |
| 978606 | 12/1964 | United Kingdom . |
| 2029678 | 3/1980 | United Kingdom .......... 219/10.55 D |

OTHER PUBLICATIONS

Conductive Elastomeric EMI Gaskets. Eaton. Item 1988, pp. 198, 200, 202 and 204.
Excerpts from Item 1988, pp. 316 and 313.
Excerpts from Item 1988, pp. 44, 46, 48, 50 and 52.
Series of Advertisements in Interferons Technology Engineer's Master, pp. 363, 367, 371, 51, 189, 181, 179 and 195.

Primary Examiner—Morris H. Nimmo
Attorney, Agent, or Firm—Browdy and Neimark

[57] ABSTRACT

An improved gasket shielding for electronic equipment is provided in the form of an integral two-layer component, namely a support layer and a cover layer, the support being strong and having excellent physical properties, and the cover layer being metal filled and having excellent electrical energy attenuation properties.

12 Claims, 1 Drawing Sheet

16 ELASTOMER (MAY BE CARBON FILLED)
18 METAL FILLED ELASTOMER

DUAL ELASTOMER GASKET SHIELD FOR ELECTRONIC EQUIPMENT

FIELD OF THE INVENTION

The present invention relates to the shielding of electronic equipment and, more particularly, to gaskets for cabinet enclosures, which cabinets are adapted to receive electronic equipment, the gaskets serving to shield the electronic equipment from damage due to exterior electromagnetic radiation.

BACKGROUND OF THE INVENTION

Producers of commercial electronic equipment, not to mention defense applications, are being forced to improve the performance of shielding devices to counteract electromagnetic interference complicated by the ever higher frequencies of energy generation in and beyond the megahertz range. Openings in cabinet enclosures for access doors, hinges, etc. must be so protected by the use of suitable shielding.

This has been an ongoing problem and various solutions have been proposed, these prior solutions however being unsatisfactory from one or more points of view. Thus, the prior devices have been insufficient from point of view of at least one or more of the following requirements:

1. Attenuation of internal and external interference using gasketing with resistive values within the range of 0.1 to 0.001 ohm-cm and selectable attenuation from 30 to 90 dB.
2. Low compression set of the gasket so long term mechanical sealing is maintained.
3. Superior physical properties of the gasket to prevent failure due to tearing forces.
4. Resistance to reduced electromagnetic shielding due to oxidation.
5. Ease of cleanliness maintenance.
6. Freedom from free metal chips as occurs with the initial fitting and subsequent deterioration of metallic meshes and metal assemblies.
7. A neat appearance of the shield.
8. Ease of installation and replacement.
9. Low cost relative to alternate designs.

There are presently available four different types of cabinet shielding means which suffer one or more defects. These are as follows:

|    | Product | Principal Inadequacy |
| --- | --- | --- |
| 1. | Carbon Filled Elastomers | Shielding ability falls off in the higher frequency range |
| 2. | Metal Filled Elastomers | Poor physical properties (compression set, tear, etc.) |
| 3. | Metal Mesh with Elastomeric Core | Hard to cut cleanly for corners; chips of free metal |
| 4. | Metallic Seals (Spring-like fingers) | Difficult to keep clean, oxidation |

SUMMARY OF THE INVENTION

It is therefore an object of the present invention to overcome deficiencies in the prior art such as indicated above.

It is another object to provide an improved gasket shielding material for electronic equipment.

It is yet another object of the present invention to provide dual elastomer gasket shielding for counteracting electromagnetic interference.

These and other objects are achieved according to the present invention by the provision of an elastomeric gasket formed in two layers, preferably by dual extrusion, in the form of a support layer having high strength, and a relatively thin coating layer having excellent ability to counteract or attenuate electromagnetic radiation.

The above and other objects and the nature and advantages of the present invention will be more apparent from the following detailed description of certain specimens embodiments thereof, taken in conjunction with the drawing, wherein:

DETAILED DESCRIPTION OF EMBODIMENTS

Figure 1:
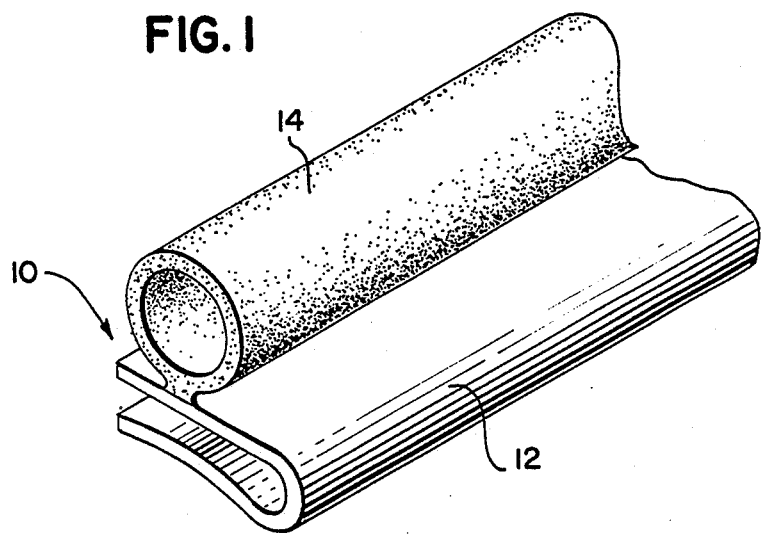
FIG. 1 is a perspective view of an EMI gasket configuration to which the subject of the present invention may be applied.
Figure 2A:
FIGS. 2a–2f are end views of other possible configurations, FIG. 2d being somewhat similar to the embodiment of FIG. 1.
Figure 2B:
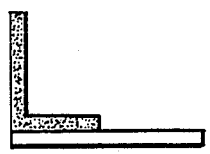
Figure 2C:
Figure 2D:
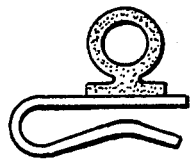
Figure 2E:
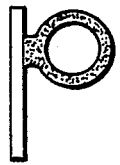
Figure 2F:
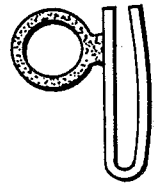
Figure 3:
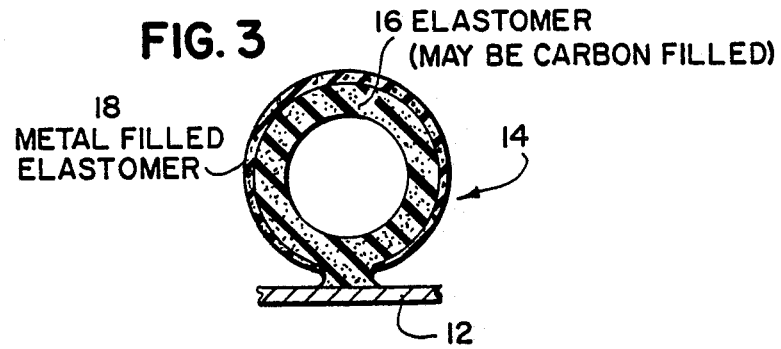
FIG. 3 is an enlarged partial cross-sectional view of the gasket of FIG. 1.

FIG. 1 shows an EMI gasket 10 of typical configuration, but in accordance with the present invention, having a metal clip part 12 and a rubber gasket part 14 adhered together. FIGS. 2a–2f show various other typical forms which may be used.

In accordance with the present invention, the gasket part 14 is formed of a non-metallic, yet conductive, elastomeric inner portion 16 to which is permanently bonded, preferably by co-extrusion within the die, and outer sheathing or covering 18 of metal-filled elastomer. From the embodiment of FIGS. 1, 3, 2a, 2b, and 2d–2f, it will be understood that such a gasket may be co-extruded and bonded during extrusion onto metallic and conductive non-metallic shapes for convenient assembly to cabinets. From FIG. 2c, it will be understood that the gasket material can be provided in other shapes which can be subsequently attached to a suitable substrate. In general, the extrusions are made in continuous length, shaped to any desired uniform cross-section.

The product can be formed onto a metallic carrier, for example a flat metal strip (see FIGS. 2a, 2e and 2b) or a roll-formed shape (FIGS. 2d and 2f) by passing the metal substrate through the co-extrusion tooling in a continuous process. The inner portion 16 is chemically locked to the metallic layer, thus ensuring transmission of electrical energy un-impeded between the co-elastomer and the metallic carrier.

The inner layer 16 is constructed of a strong elastomeric material which has good physical properties, including high tear resistance, as well as the ability to recover shape after deformation, i.e. good elasticity. This material is desirably carbon filled rubber.

The metal filled exterior covering 18 provides a higher degree of attenuation of electrical energy than presently available non-metal filled elastomeric shielding. On the other hand, such metal filled elastomer used alone as a shielding material suffers from poor physical properties, including low tearing resistance, and its recovery of shape after deformation is poor. The metal filler does not reinforce the elastomer and acts as a diluent. Furthermore, as the cost of the metal, usually silver, is relatively high, it is desirable to minimize the quantity of the material used.

By chemically bonding a metal-filled elastomer 18 to a carbon-filled elastomer substrate 16, the amount of expensive metal filler used is minimized and the tear resistance and compression recovery of the gasket 14 substantially improved. In addition, the shielding effectiveness is substantially improved over the use of carbon-filled rubber alone. The product is easily cleaned to maintain shielding effectiveness and presents a neat appearance.

When the two elastomers 16 and 18 are simultaneously bonded under the pressure of co-extrusion, the unity of the resultant gasket is assured and electrical and physical results are optimum.

It will be understood that both layers 16 and 18 are conductive, except that the outer layer 18 is considerably more conductive while the inner layer 16 is less conductive but much stronger and with better physical properties. They are bonded by co-extrusion in a molecular sharing way, and thus provide a superior electrical shield over either one used alone.

The inner layer 16 is substantially thicker than the outer coating, preferably on the order of 5-20 times as thick when such layer 16 is hollow as preferred, preferably at a thickness ratio of 10:1, the outer coating 18 desirably being 2-8 mils thick and the inner support layer 16 being 5-160 mils thick, preferably 20-80 mils thick.

The inner support layer may be formed of a variety of elastomers, but preferably it comprises an elastomeric silicone polymer containing fumed silica and carbon black as reinforcers, plus a suitable cross-linking agent. Alternatively, the inner layer 16 may be composed of a non-conductive silicone elastomer, such as one comprising silicone gum, fumed silica and a cross-linking agent. The covering layer 18 is suitably formed of an elastomeric silicone polymer filled with glass or copper beads coated with silver.

The following Example is offered illustratively.

EXAMPLE

Suitable materials from which to form the inner and outer cores are set forth below in Table 1, and the properties of the resultant gasket according to the present invention are set forth in Table 2 below.

TABLE 1

|  | INNER CORE | OUTER CORE |
| --- | --- | --- |
| Silicone Polymer | 100 parts by weight | 100 parts by weight |
| Fumed Synthetic Silica | 30 parts by weight | 0 |
| Carbon Black, Ketjen E300 | 20 parts by weight | 0 |
| Silver Coated Copper | 0 | 70 parts by weight |
| DiCumyl Peroxide Curative, 90% Active | 2 parts by weight | 2 parts by weight |
| Colorant |  | Selectable |
| Metal Bonding Agent | as applicable | 0 |

TABLE 2

| Typical Combined Properties of Silicone & Carbon With Silver-Silicone Co-Extrusion Cover | |
| --- | --- |
| Volume Resistivity, ASTM D-91 | 0.02 ohm-cm |
| Shielding Effectiveness, dB at 10 GHz Plane Wave | 85 Minimum |
| Specific Gravity, combined | 1.25 |
| Tensile Strength, psi | 700 |
| Elongation, % | 165 |

TABLE 2-continued

| Typical Combined Properties of Silicone & Carbon With Silver-Silicone Co-Extrusion Cover | |
| --- | --- |
| Tear Strength, lb/inch | 67 |
| Durometer Hardness, Shore A | 60 |
| Compression Set Method B-22 Hrs. @ 212° F. | 24% |

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation.

What is claimed is:

1. In a gasket shield for counteracting electromagnetic interference comprising a flexible gasket element, the improvement wherein said gasket element comprises a relatively thick elastomeric inner layer of good elasiticity and high tear resistance, and a relatively thin elastomeric outer layer integral therewith, said outer layer being metal filled and providing a high degree of attenuation of electrical energy.

2. A gasket shield according to claim 1, wherein said inner layer is conductive.

3. A gasket shield according to claim 1, wherein said inner layer is on the order of 10 times thicker than said outer layer.

4. A gasket shield according to claim 1 wherein said outer layer has a thickness of no greater than about 8 mils.

5. A gasket shield according to claim 3 wherein said inner and outer layers are formed of cross-linked rubber.

6. A gasket shield according to claim 1 wherein said inner and outer layers are formed of silicone rubber.

7. A gasket shield according to claim 6 wherein said inner layer comprises a non-conductive, fumed silica reinforced silicone rubber.

8. A gasket shield according to claim 6 wherein said inner layer comprises a conductive, carbon-black and fumed silica reinforced silicone rubber.

9. In a gasket shield for counteracting electromagnetic interference comprising a flexible gasket element, the improvement wherein said gasket element comprises a relatively thick elastomeric inner layer of good elasticity and high strength, and a relatively thin outer layer integral therewith, said outer layer being metal filled and providing a high degree of attenuation of electrical energy, wherein said inner and outer layers are chemically bonded to one another.

10. In a gasket shield for counteracting electromagnetic interference comprising a flexible gasket element, the improvement wherein said gasket element comprises a relatively thick elastomeric inner layer of good elasticity and high strength, and a relatively thin outer layer integral therewith, said outer layer being metal filled and providing a high degree of attenuation of electrical energy, wherein said inner and outer layers are co-extruded.

11. In a gasket shield for counteracting electromagnetic interference comprising a flexible gasket element, the improvement wherein said gasket element comprises a relatively thick elastomeric inner layer of good elasticity and high strength, and a relatively thin outer layer integral therewith, said outer layer being metal filled and providing a high degree of attenuation of electrical energy, further comprising a metallic substrate chemically locked thereto.

12. A gasket shield for counteracting electromagnetic interference comprising a flexible gasket element having a relatively thick elastomeric inner layer of good elasticity and strength, formed of carbon-filled rubber, and a relatively thin outer layer integral therewith, said outer layer being metal-filled rubber and providing a high degree of attenuation of electrical energy.

* * * * *

(12) EX PARTE REEXAMINATION CERTIFICATE (5374th)
United States Patent
Benn, Sr. et al.

(10) Number: US 4,968,854 C1
(45) Certificate Issued: May 23, 2006

(54) DUAL ELASTOMER GASKET SHIELD FOR ELECTRONIC EQUIPMENT

(75) Inventors: Robert C. Benn, Sr., Danbury, CT (US); Robert C. Benn, Jr., Danbury, CT (US)

(73) Assignee: Vanguard Products Corporation, Danbury, CT (US)

Reexamination Request:
No. 90/006,619, May 5, 2003

Reexamination Certificate for:
Patent No.: 4,968,854
Issued: Nov. 6, 1990
Appl. No.: 07/269,350
Filed: Nov. 10, 1988

(51) Int. Cl.
*H05K 9/00* (2006.01)

(52) U.S. Cl. .................. 174/35 GC; 277/920

(58) Field of Classification Search .............. 174/35 R, 174/35 MS, 35 GC; 361/816, 818; 277/920
See application file for complete search history.

(56) References Cited

U.S. PATENT DOCUMENTS 3,140,342 A  7/1964  Ehrreich et al.
4,659,869 A  4/1987  Busby

FOREIGN PATENT DOCUMENTS

CA  903020  6/1972
CA  1116650  1/1982

*Primary Examiner*—Hing V Ngo

(57) ABSTRACT

An improved gasket shielding for electronic equipment is provided in the form of an integral two-layer component, namely a support layer and a cover layer, the support being strong and having excellent physical properties, and the cover layer being metal filled and having excellent electrical energy attenuation properties.

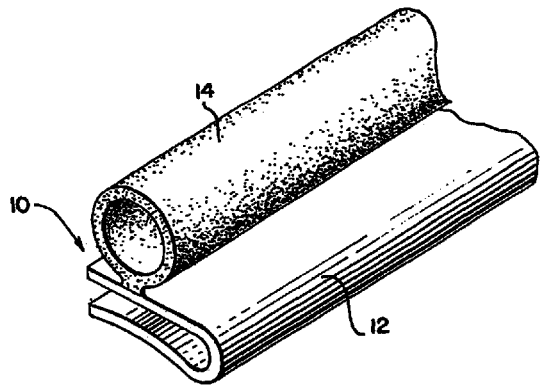
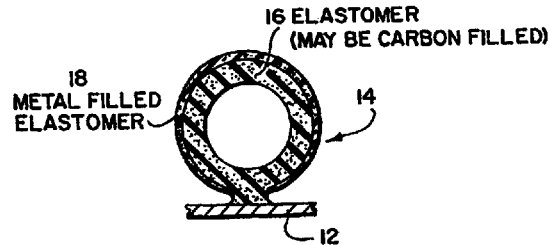

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1–8 and 12 is confirmed.

Claims 9, 10 and 11 are determined to be patentable as amended.

New claims 13, 14 and 15 are added and determined to be patentable.

9. In a gasket shield for counteracting electromagnetic interference comprising a flexible gasket element, the improvement wherein said gasket element comprises a relatively thick elastomeric inner layer of good elasticity and high strength, and a relatively thin *elastomeric* outer layer integral therewith, said outer layer being metal filled and providing a high degree of attenuation of electrical energy, wherein said inner and outer layers are chemically bonded to one another.

10. In a gasket shield for counteracting electromagnetic interference comprising a flexible gasket element, the improvement wherein said gasket element comprises a relatively thick elastomeric inner layer of good elasticity and high strength, and a relatively thin *elastomeric* outer layer integral therewith, said outer layer being metal filled and providing a high degree of attenuation of electrical energy, wherein said inner and outer layers are co-extruded.

11. In a gasket shield for counteracting electromagnetic interference comprising a flexible gasket element, the improvement wherein said gasket element comprises a relatively thick elastomeric inner layer of good elasticity and high strength, and a relatively thin *elastomeric* outer layer integral therewith, said outer layer being metal filled and providing a high degree of attenuation of electrical energy, further comprising a metallic substrate chemically locked thereto.

*13. A gasket shield according to claim 1 wherein the inner layer has a thickness of about 20 mils to about 160 mils and the outer layer has a thickness of about 2 mils to about 8 mils.*

*14. A gasket shield according to claim 1 wherein the inner layer has a hollow profile.*

*15. A gasket shield according to claim 13 wherein the inner layer has a hollow profile.*

\* \* \* \* \*